United States Patent
Na et al.

(10) Patent No.: US 8,269,560 B2
(45) Date of Patent: Sep. 18, 2012

(54) POWER AMPLIFYING APPARATUS

(75) Inventors: Jun Kyung Na, Gyunggi-do (KR); Youn Suk Kim, Gyunggi-do (KR); Sang Hoon Ha, Gyunggi-do (KR); Shinichi Iizuka, Gyunggi-do (KR); Sang Wook Park, Gyunggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 0 days.

(21) Appl. No.: 13/094,010

(22) Filed: Apr. 26, 2011

(65) Prior Publication Data

US 2012/0154052 A1 Jun. 21, 2012

(30) Foreign Application Priority Data

Dec. 15, 2010 (KR) .......................... 10-2010-0128302

(51) Int. Cl.
  *H03G 3/10* (2006.01)
(52) U.S. Cl. ........................................ 330/285; 330/296
(58) Field of Classification Search .................. 330/285, 330/296, 297, 207 P, 298
  See application file for complete search history.

(56) References Cited

U.S. PATENT DOCUMENTS

| | | | | |
|---|---|---|---|---|
| 7,173,491 B2* | 2/2007 | Bocock et al. | ................. | 330/285 |
| 7,489,196 B2* | 2/2009 | Vaiana et al. | ................. | 330/285 |
| 7,551,032 B2* | 6/2009 | Dupuis et al. | ................. | 330/285 |
| 7,843,271 B2* | 11/2010 | Seaberg | ......................... | 330/296 |
| 7,872,533 B2* | 1/2011 | Adamski et al. | ............... | 330/297 |
| 8,008,974 B2* | 8/2011 | Ha et al. | ......................... | 330/285 |

FOREIGN PATENT DOCUMENTS

JP 2001264365 9/2001

* cited by examiner

*Primary Examiner* — Henry Choe
(74) *Attorney, Agent, or Firm* — Lowe, Hauptman, Ham & Berner, LLP

(57) ABSTRACT

There is provided a power amplifying apparatus including: a power amplifier; a power regulator providing a driving voltage and a driving current corresponding to a control voltage to the power amplifier; a current sensing unit sensing a current and a voltage corresponding to the driving current and controlling the driving voltage according to the sensed current; a current control unit controlling a current bias according to the sensed voltage of the current sensing unit; and a current bias circuit unit controlling a bias current of the power amplifier according to the controlling of the current control unit.

16 Claims, 3 Drawing Sheets

POWER AMPLIFYING APPARATUS

CROSS-REFERENCE TO RELATED APPLICATIONS

This application claims the priority of Korean Patent Application No. 10-2010-0128302 filed on Dec. 15, 2010, in the Korean Intellectual Property Office, the disclosure of which is incorporated herein by reference.

BACKGROUND OF THE INVENTION

1. Field of the Invention

The present invention relates to a power amplifying apparatus, and more particularly, to a power amplifying apparatus applicable to a communication device transmission system and having improved current control performance and a reduction in size and cost as compared to the related art without the need for a separate current mirror circuit for sensing current.

2. Description of the Related Art

Generally, in a radio frequency (RF) block of a mobile communications terminal, a power amplifier is used in order to amplify an RF signal output.

Research into a power amplifier, to which complementary metal oxide semiconductor (CMOS) technology appropriate for the compactness and integration thereof is applied, has been actively conducted. In addition, a power regulator (called a low drop output (LDO)), implemented to be appropriate for the power amplifier, has been developed in order to stably control an operation of the power amplifier. Research into technology for supplying more stable power using the power regulator has been conducted.

The power regulator (LDO) includes a plurality of power PMOS transistors connected in parallel with each other in order to supply current, required in the power amplifier in a sufficient amount.

Each of the plurality of power PMOS transistors supplies a current having a preset level, and the currents supplied through the plurality of individual power PMOS transistors are totaled, whereby the current required in the power amplifier may be supplied.

A stable operation of an analog control block supplying the power to the power amplifier using the power regulator is required.

A power amplifying apparatus according to the related art is configured to include a power regulator supplying a current Id and a voltage Vdd controlled according to an inputted control voltage Vramp and a power amplifier having a power transistor receiving the current and the voltage from the power regulator and amplifying the power of the input signal Sin.

In addition, the power regulator includes a plurality of power PMOS transistors, which are operated at a low source-drain voltage and thus, are operated in a triode region in which a large change in drain current is generated even in the case of a small change in the source-drain voltage, such that a large change in current is generated even in the case of a small change in voltage. Accordingly, under these operation conditions, control of the current should be performed.

In this configuration, in order to accurately control driving currents provided to the power regulator, sensing PMOS transistors, sensing driving currents flowing in the plurality of individual PMOS transistors included in the power regulator, are connected thereto.

The power amplifying apparatus further includes a current mirror circuit mirroring the driving current sensed by the sensing PMOS transistor. The power amplifying apparatus converts the sensed current through the current mirror circuit into voltage, and then controls current bias of the power amplifier based on a voltage difference between the converted voltage and a reference voltage.

However, the power amplifying apparatus according to the related art includes the current mirror circuit, thereby causing increases in both the size and cost thereof.

In addition, since the power amplifying apparatus includes the current mirror circuit, as an electrical length of a passive element included in the power amplifying apparatus becomes elongated, an error is generated between the sensed voltage and the reference voltage, such that the driving current may not be accurately controlled.

SUMMARY OF THE INVENTION

An aspect of the present invention provides a power amplifying apparatus having a reduction in size and manufacturing costs by being configured without a current mirror circuit and having improved current control performance by removing a load limiting phenomenon.

According to an aspect of the present invention, there is provided a power amplifying apparatus including: a power amplifier; a power regulator providing a driving voltage and a driving current corresponding to a preset control voltage to the power amplifier; a current sensing unit sensing a current and a voltage corresponding to the driving current and controlling the driving voltage according to the sensed current; a current control unit controlling a current bias according to the sensed voltage of the current sensing unit; and a current bias circuit unit controlling a bias current of the power amplifier according to the controlling of the current control unit.

According to another aspect of the present invention, there is provided a power amplifying apparatus including: a power amplifier; a power regulator providing a driving voltage and a driving current corresponding to a preset control voltage to the power amplifier; a current sensing unit sensing a current and a voltage corresponding to the driving current and controlling the driving voltage according to the sensed current; a current control unit controlling a current bias according to the sensed voltage of the current sensing unit; and a current bias circuit unit controlling a bias current of the power amplifier according to the controlling of the current control unit, wherein the current control unit is configured to control the current bias so that the control voltage follows the sensed voltage of the current sensing unit, and the current control unit includes: a current control amplifier having a first input terminal receiving a first voltage corresponding to the sensed voltage, a second input terminal receiving the control voltage, and an output terminal providing a gate voltage for controlling the bias current according to a voltage difference between the sensed voltage and the control voltage to the current bias circuit unit; and a looplock circuit controlling a level of an input voltage inputted to the second input terminal of the current control amplifier according to a level of an output voltage of the current control amplifier.

The first input terminal of the current control amplifier may be a non-inverted input terminal, and the second input terminal thereof may be an inverted input terminal The power regulator may include a power transistor circuit including a first PMOSFET having a source connected to a first power supply terminal, a gate, and a drain connected to a power supply node of the power amplifier and supplying the driving voltage and the driving current to the power amplifier according to a gate voltage of the first PMOSFET; and a first error amplifier having an inverted input terminal receiving the control voltage, a non-inverted input terminal connected to the drain of the first PMOSFET through a first resistor and connected to a ground through a second resistor, and an output terminal connected to the gate of the first PMOSFET to provide the gate voltage.

The power regulator may further include a first coil connected between a first connection node between the drain of the first PMOSFET and the first resistor and the power supply node of the power amplifier.

The current sensing unit may include a sensing transistor circuit including a second PMOSFET having a source connected to the first power supply terminal for receiving a power supply voltage, a gate connected to the gate of the first PMOSFET, and a drain, and sensing a current corresponding to a current flowing in the first PMOSFET; a current control circuit including a first NMOSFET having a drain connected to the drain of the second PMOSFET, a gate, and a source; a second error amplifier having an inverted input terminal connected to the first connection node, a non-inverted input terminal connected to a second connection node between the second PMOSFET and the first NMOSFET, and an output terminal connected to the gate of the first NMOSFET; and a voltage sensing unit sensing a sensed voltage corresponding to a sensed current flowing in the second PMOSFET and the first NMOSFET.

The looplock circuit may include a sensing circuit sensing a level of the output voltage of the current control amplifier using a plurality of resistors connected between the output terminal of the current control amplifier and a ground; and a second NMOSFET having a gate receiving a voltage of the sensing circuit, a drain connected to the second input terminal of the current control amplifier, and a gate connected to the ground, and having an internal resistor controlled according to a voltage level of the sensing circuit.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
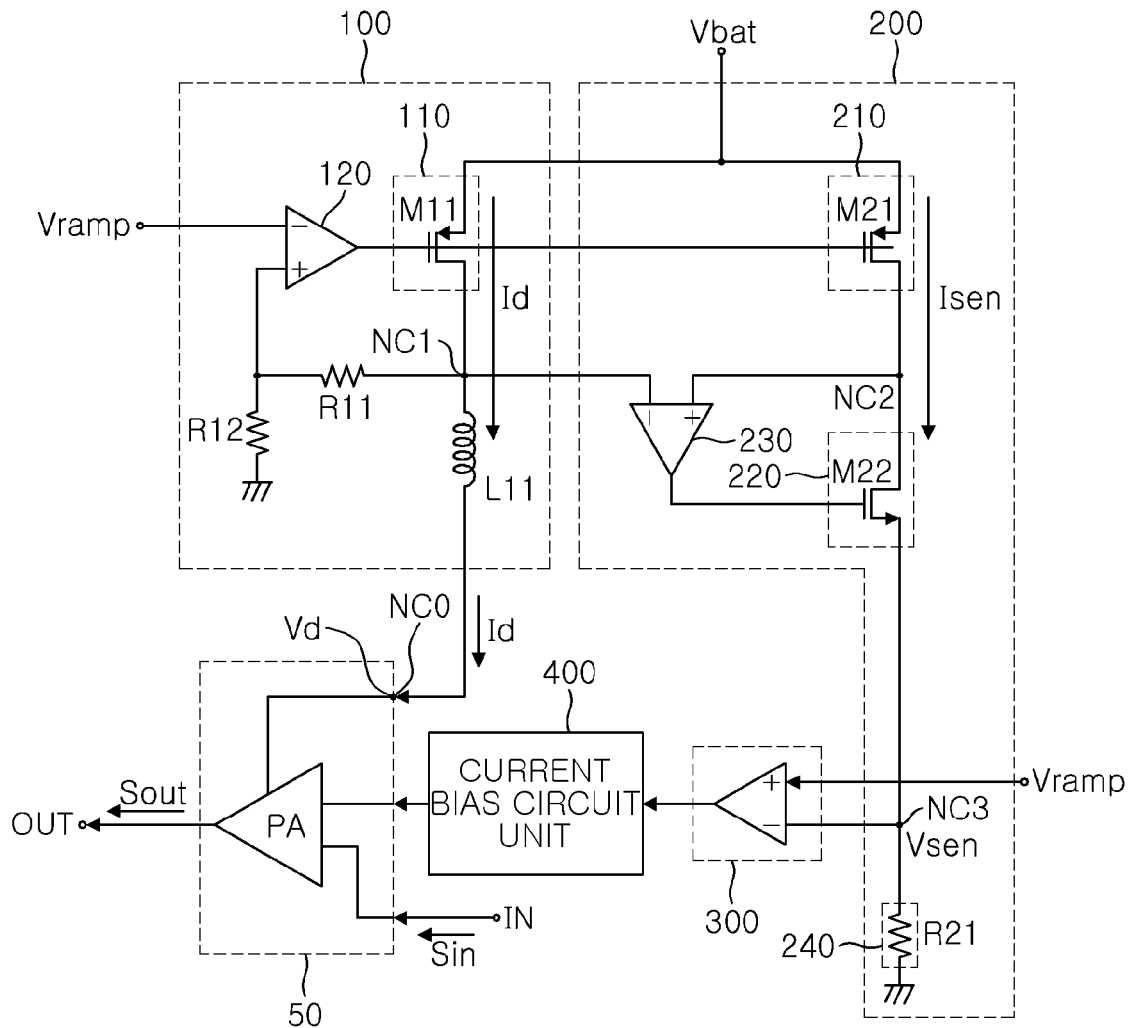
FIG. 1 is a block diagram of a power amplifying apparatus according to an exemplary embodiment of the present invention.

Exemplary embodiments of the present invention will now be described in detail with reference to the accompanying drawings.

The present invention should not be limited to the embodiments set forth herein and the embodiments may be used to assist in understanding the technical idea of the present invention. Like reference numerals designate like components having substantially the same constitution and function in the drawings of the present invention.

FIG. 1 is a block diagram of a power amplifying apparatus according to an exemplary embodiment of the present invention.

Referring to FIG. 1, a power amplifying apparatus according to an exemplary embodiment of the present invention includes a power amplifier 50 amplifying an input signal Sin provided through an input terminal IN to output an output signal Sout through an output terminal OUT.

The power amplifying apparatus may include a power regulator 100 receiving a power supply voltage Vbat through a first power supply terminal and providing a driving voltage Vd and a driving current Id corresponding to a preset control voltage Vramp to the power amplifier 50.

The power amplifying apparatus may include a current sensing unit 200 connected to the first power supply terminal, sensing a current and a voltage corresponding to the driving current Id, and controlling the driving voltage Vd according to the sensed current.

The power amplifying apparatus may include a current control unit 300 controlling a current bias according to the sensed voltage of the current sensing unit 200.

The power amplifying apparatus may include a current bias circuit unit 400 controlling the bias current of the power amplifier 50 according to the control of the current control unit 300.

Referring to FIG. 1, the power regulator 100 may include a power transistor circuit 110 including a first PMOSFET M11 having a source connected to the first power supply terminal, a gate, and a drain connected to a power supply node NC0 of the power amplifier 50, and supplying the driving voltage Vd and the driving current Id to the power amplifier 50 according to a gate voltage of the first PMOSFET.

The power regulator 100 may include a first error amplifier 120 having an inverted input terminal receiving the control voltage Vram, a non-inverted input terminal connected to the drain of the first PMOSFET M11 through a first resistor R11 and connected to a ground through a second resistor R12, and an output terminal connected to the gate of the first PMOSFET M11 to provide the gate voltage.

In addition, the power regulator 100 may further include a first coil L11 connected between a first connection node NC1, between the drain of the first PMOSFET M11 and the first resistor R11, and the power supply node NC0 of the power amplifier 50.

Referring to FIG. 1, the current sensing unit 200 may include a sensing transistor circuit 210 including a second PMOSFET M21 having a source connected to the first power supply terminal, a gate connected to the gate of the first PMOSFET M11, and a drain, and sensing a current corresponding to a current flowing in the first PMOSFET M11.

The current sensing unit 200 may include a current control circuit 220 including a first NMOSFET M22 having a drain connected to the drain of the second PMOSFET M21, a gate, and a source.

The current sensing unit 200 may include a second error amplifier 230 having an inverted input terminal connected to the first connection node NC1, a non-inverted input terminal connected to a second connection node NC2 between the second PMOSFET M21 and the first NMOSFET M22, and an output terminal connected to the gate of the first NMOSFET M22.

In addition, the current sensing unit 200 may include a voltage sensing unit 240 sensing a sensed voltage Vsen corresponding to a sensed current Isen flowing in the second PMOSFET M21 and the first NMOSFET M22. Herein, the voltage sensing unit 240 may include a sensing resistor R21 connected between the first NMOSFET M22 and a ground, and the sensed voltage Vsen is sensed at a third node NC3 between the source of the first NMOSFET M22 and the sensing resistor R21.

In this configuration, each of the first error amplifier 120, the first PMOSFET M11, the second PMOSFET M21, the first NMOSFET M22, and the second error amplifier 230 may be provided alone or in plural.

Meanwhile, the current control unit 300 may be configured to control the current bias so that the control voltage Vramp follows the sensed voltage Vsen of the current sensing unit 200.

The current control unit 300 may include a current control amplifier having a first input terminal receiving a first voltage corresponding to the sensed voltage Vsen, a second input terminal receiving the control voltage Vramp, and an output terminal providing a gate voltage for controlling the bias current according to a voltage difference between the sensed voltage Vsen and the control voltage Vramp to the current bias circuit unit 400.

Figure 2:
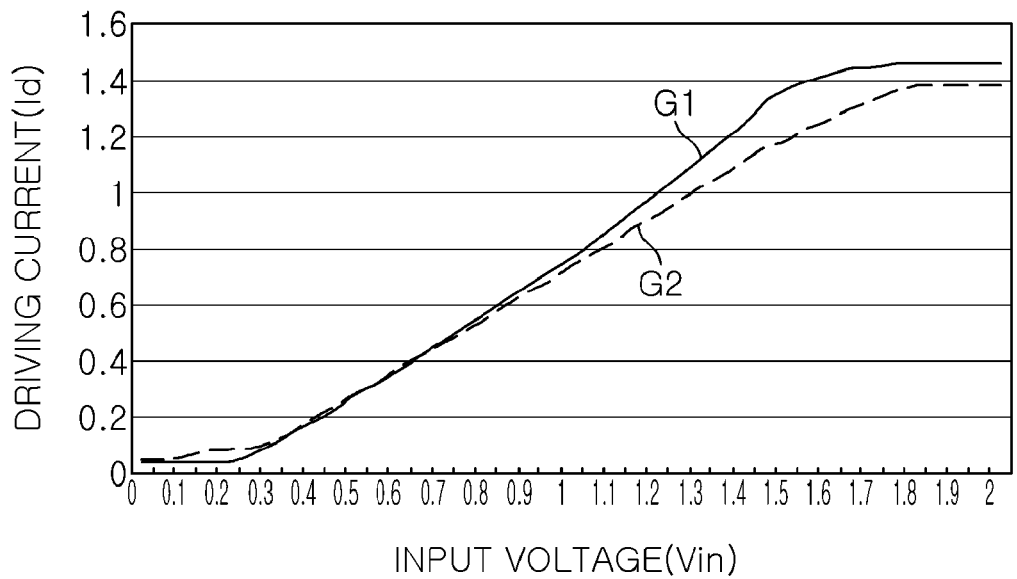
FIG. 2 is a graph showing a relationship between an input voltage and a driving current of the power amplifying apparatus of FIG. 1.

FIG. 2 is a graph showing a relationship between an input voltage and a driving current of the power amplifying apparatus of FIG. 1. In FIG. 2, G1 is a graph showing a relationship between an input voltage and a driving current of a power amplifying apparatus according to the related art, and G2 is a graph showing a relationship between an input voltage and a driving current of a power amplifying apparatus according to an exemplary embodiment of the present invention.

Figure 3:
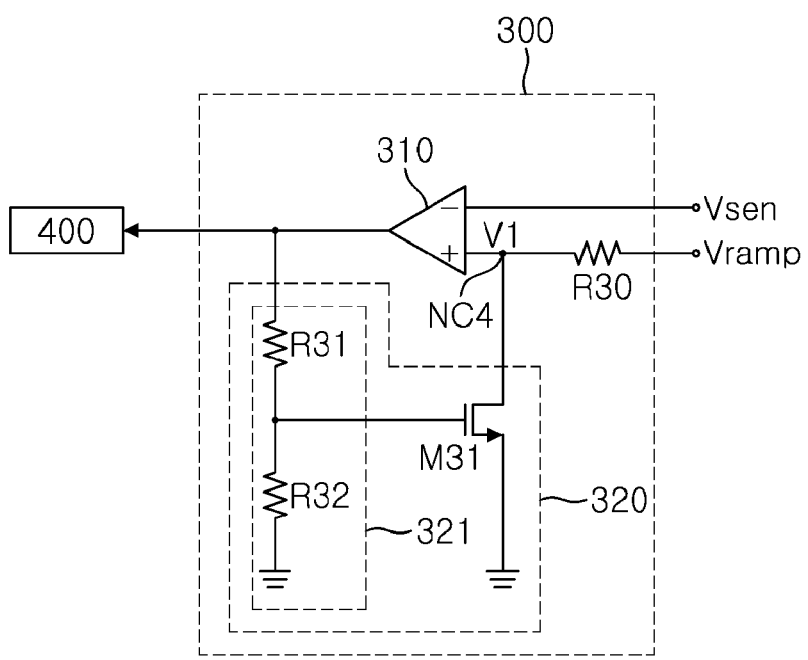
FIG. 3 is a diagram of a current control unit of a power amplifying apparatus according to another exemplary embodiment of the present invention.

FIG. 3 is a diagram of a current control unit of a power amplifying apparatus according to another exemplary embodiment of the present invention.

Referring to FIG. 3, a current control unit 300 of a power amplifying apparatus according to another exemplary embodiment of the present invention will be described.

Referring to FIG. 3, the current control unit 300 according to another exemplary embodiment of the present invention may include a current control amplifier 310 and a looplock circuit 320.

The current control amplifier 310 includes a first input terminal receiving a first voltage corresponding to the sensed voltage Vsen, a second input terminal receiving the control voltage Vramp, and an output terminal providing a gate voltage for controlling the bias current according to a voltage difference between the sensed voltage Vsen and the control voltage Vramp to the current bias circuit unit 400. In the current control amplifier 310, the first input terminal is a non-inverted input terminal and the second input terminal is an inverted input terminal, or vice versa.

In addition, the looplock circuit 320 of the current control unit 300 may be configured to control a level of an input voltage inputted to the second input terminal of the current control amplifier 310 according to a level of an output voltage of the current control amplifier 310.

For example, the looplock circuit 320 may include a sensing circuit 321 sensing a level of the output voltage of the current control amplifier 310 using a plurality of resistors R31 and R32 connected between the output terminal of the current control amplifier 310 and a ground.

In addition, the looplock circuit 320 may include a second NMOSFET M31 having a gate receiving a voltage of the sensing circuit 321, a drain connected to a fourth connection node NC4 corresponding to the second input terminal of the current control amplifier 310, and a gate connected to the ground, and an internal resistor controlled according to a voltage level of the sensing circuit 321.

Figure 4:
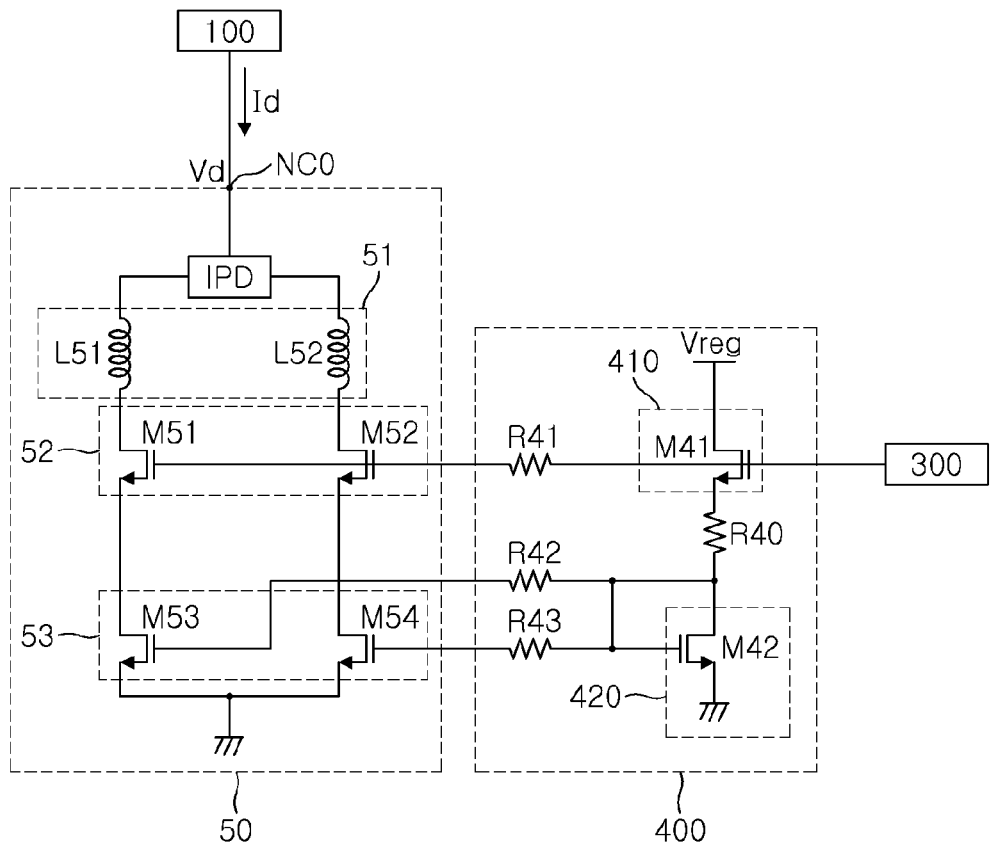
FIG. 4 is a diagram of a power amplifier and a current bias circuit unit according to an exemplary embodiment of the present invention.

FIG. 4 is a diagram of a power amplifier and a current bias circuit unit according to an exemplary embodiment of the present invention.

Referring to FIG. 4, the current bias circuit unit 400 may be configured to include a third NMOSFET M41 and a fourth NMOSFET M42 operating according to control of the current control unit and formed in a cascode structure.

As an example, the third NMOSFET M41 has a drain connected to a second power supply terminal for receiving a preset regulating voltage Vreg, a gate connected to the output terminal of the looplock circuit 320, and a source.

In addition, the fourth NMOSFET M42 of the current bias circuit unit 400 has a drain connected to the source of the third NMOSFET M31 through a resistor R40, a gate, and a source connected to the ground.

Referring to FIG. 4, the power amplifier 50 may include an integrated passive device (IPD) transferring the driving voltage Vd and the driving current Id from the power regulator 100 to first and second terminals thereof.

The power amplifier 50 may include a coil unit 51 having a first coil L51 connected to the first terminal of the IPD and a second coil L52 connected to the second terminal of the IPD.

The power amplifier 50 may include a first amplifying unit 52 having a bias controlled according to the control of the current bias circuit unit 400, and a second amplifying unit 53 connected to the first amplifying unit 52 in a cascode structure and having a bias controlled according to the control of the current bias circuit unit 400.

As an example, the first amplifying unit 52 may include a fifth NMOSFET M51 having a drain connected to the first coil L51, a gate connected to the gate of the third NMOSFET M41 through a resistor R41, and a source, and a sixth NMOSFET M52 having a drain connected to the second coil L52, a gate connected to the gate of the fifth NMOSFET M51, and a source.

In addition, as an example, the second amplifying unit 53 may include a seventh NMOSFET M53 having a drain connected to the source of the fifth NMOSFET M51, a gate connected to the gate and the drain of the fourth NMOSFET M42 through a resistor R42, and a source connected to the ground, and an eighth NMOSFET M54 having a drain connected to the source of the sixth NMOSFET M52, a gate connected to the gate of the fourth NMOSFET M42 through a resistor R43, and a source connected to the ground.

Figure 5:
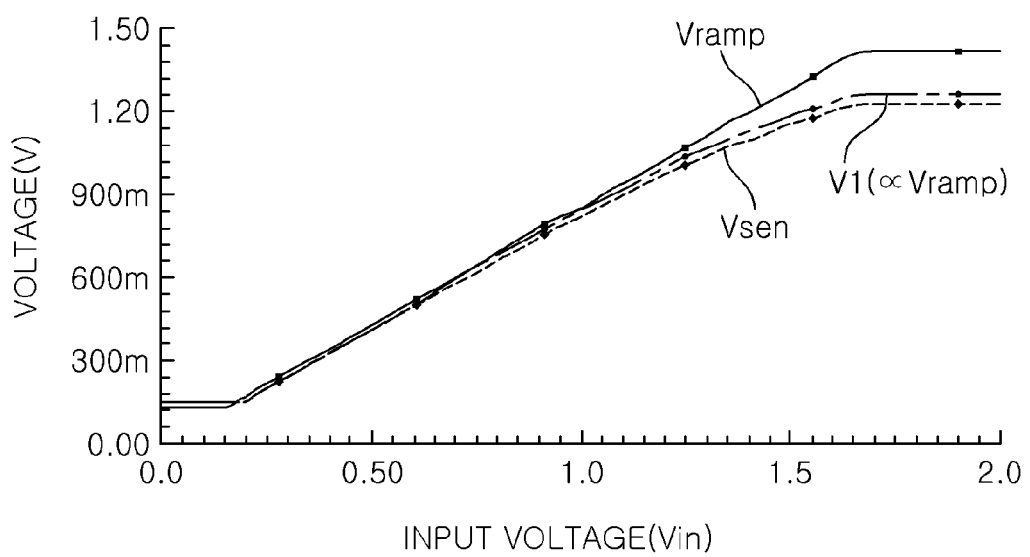
FIG. 5 is a graph showing voltage characteristics of a power amplifying apparatus according to another exemplary embodiment of the present invention.

FIG. 5 is a graph showing the voltage characteristics of a power amplifying apparatus according to another exemplary embodiment of the present invention.

Referring to FIG. 5, Vramp is a control voltage inputted to the power regulator 100. Vsen is a sensed voltage corresponding to a sensed current Isen from the current sensing unit 200. In addition, V1 is a voltage applied to the first input terminal of the current control amplifier 310 and corresponding to the sensed voltage Vsen.

Hereinafter, the operations and effects of the present invention will be described in detail with reference to the accompanying drawings.

An power amplifying apparatus according to an exemplary embodiment of the present invention will be described with reference to FIGS. 1 through 5. First, the power amplifying apparatus according to an exemplary embodiment of the present invention will be described with reference to FIG. 1.

Referring to FIG. 1, the power amplifier 50 of the power amplifying apparatus amplifies the input signal Sin provided through the input terminal IN to output the output signal Sout through the output terminal OUT. At this time, the driving voltage Vd and the driving current Id of the power amplifier 50 may be set through a control operation described below.

First, the power regulator 100 of the power amplifying apparatus receives the power supply voltage Vbat through the first power supply terminal and provides the driving voltage Vd and the driving current Id corresponding to the preset control voltage Vramp to the power amplifier 50.

The current sensing unit 200 of the power amplifying apparatus is connected to the first power supply terminal, senses the current and the voltage corresponding to the driving voltage Id, and controls the driving voltage Vd according to the sensed current Isen.

The current control unit 300 of the power amplifying apparatus may control the current bias according to the sensed current Isen of the current sensing unit 200.

The current bias circuit unit 400 of the power amplifying apparatus may control the bias current of the power amplifier 50 according to the control of the current control unit 300.

In addition, an example of the power regulator 100 including the power transistor circuit 110 and the first error amplifier 120 will be described with reference to FIG. 1.

First, the power transistor circuit 110 may include the first PMOSFET M11, as described above. In this configuration, the power transistor circuit 110 may provide the driving voltage Vd and the driving current Id controlled according to the gate voltage of the first PMOSFET M11 to the power amplifier 50.

In addition, the control voltage Vramp is inputted to the inverted input terminal of the first error amplifier 120, and a voltage (a voltage applied to R12) formed by dividing the voltage, applied to the first connection node NC1 between the drain of the first PMOSFET M11 and the first resistor R11, by the first and second resistors R11 and R12 is inputted to the non-inverted input terminal of the first error amplifier 120.

In this configuration, the first error amplifier 120 applies the gate voltage, corresponding to the voltage difference between the control voltage Vramp inputted to the inverted input terminal and the voltage inputted to the non-inverted input terminal, to the gate of the first PMOSFET M11 of the power transistor circuit 110.

Accordingly, the first PMOSFET M11 may provide the driving voltage and the driving current controlled according to the gate voltage to the power amplifier 50.

In addition, the power regulator 100 may further include the first coil L11, as described above, and the first coil L11 may improve the quality of the driving voltage Vd by removing an alternating current component, such as a ripple, or the like, of the driving voltage Vd.

An example of the current sensing unit 200 including the sensing transistor circuit 210, the current control circuit 220, the second error amplifier 230, and the voltage sensing unit 240 will be described with reference to FIG. 1.

The current sensing unit 200 may include the sensing transistor circuit 210 including the second PMOSFET M21, the current control circuit 220 including the first NMOSFET M22, and the second error amplifier 230.

In this configuration, the second PMOSFET M21 of the sensing transistor circuit 210 may form a current mirror circuit with the first PMOSFET M11 to sense the current corresponding to the driving current flowing in the first PMOSFET M11, as described above.

For example, when the second PMOSFET M21 and the first PMOSFET M11 has a size (for example, a channel width) of 1000:1, the second PMOSFET M21 may sense a current corresponding to $1/1000$ of the driving current Id flowing in the first PMOSFET M11.

The first NMOSFET M22 of the current control circuit 220 controls the current flowing in the second PMOSFET according to the gate voltage thereof.

The second error amplifier 230 receives the voltage applied to the first connection node NC1 through the inverted input terminal, and receives the voltage applied to the second connection node NC2 between the second PMOSFET M21 and the first NMOSFET M22 through the non-inverted input terminal.

In this configuration, the second error amplifier 230 provides the voltage difference between two voltages received through the inverted input terminal and the non-inverted input terminal as the gate voltage to the gate of the first NMOSFET M22. Accordingly, the second error amplifier 230 controls the first NMOSFET M22 using the gate voltage so that the two voltages received through the inverted input terminal and the non-inverted input terminal become identical to each other.

In addition, the voltage sensing unit 240 senses the sensed voltage Vsen corresponding to the sensed current Isen flowing in the second PMOSFET M21 and the first NMOSFET M22 to provide the sensed voltage to the current control unit 300.

The current control unit 300 may control the current bias so that the control voltage Vramp follows the sensed voltage Vsen of the current sensing unit 200.

As viewed in the graph G1 of FIG. 2 showing the relationship between the input voltage and the driving current of the power amplifying apparatus according to the related art, it may be appreciated that the relationship between the input voltage Vin and the driving current Id is nonlinear, and as the input voltage Vin becomes higher, non-linearity is intensified, and particularly, the non-linearity is further intensified between 1.4 V and 1.7 V.

On the other hand, as viewed in the graph G2 showing the relationship between the input voltage and the driving current of the power amplifying apparatus according to the exemplary embodiment of the present invention, the relationship between the input voltage Vin and the driving current Id is approximately linear. Particularly, it may be appreciated that the linearity is excellent even between 1.4V and 1.7V, as compared to the graph G1.

Accordingly, the power amplifying apparatus according to the exemplary embodiment of the present invention does not additionally include the related art current mirror circuit mirroring the driving current in order to sense the driving current Id to thereby fundamentally prevent the generation of an error between the sensed voltage and the reference voltage caused by the current mirror circuit, whereby the driving current may be more accurately, that is, linearly, controlled.

An example of the current control unit 300 including the current control amplifier 310 will be described with reference to FIGS. 1 and 3. The current control amplifier 310 receives a first voltage corresponding to the sensed voltage Vsen through the first input terminal, and receives the control voltage Vramp through the second input terminal.

In this configuration, the current control amplifier 310 may provide the gate voltage for controlling the bias current according to the voltage difference between the sensed voltage Vsen and the control voltage Vramp to the current bias circuit unit 400 and control the current bias circuit unit 400 using the gate voltage.

Meanwhile, an example of the current control unit 300 including the current control amplifier 310 and the looplock circuit 320 will be described with reference to FIG. 3. In this configuration, the current control amplifier 310 operates as described above. Therefore, a description of the operation of the current control amplifier 310 will be omitted.

In FIG. 3, the looplock circuit 320 may control the level of the input voltage inputted to the second input terminal of the current control amplifier 310 according to the level of the output voltage of the current control amplifier 310.

More specifically, as shown in FIG. 3, an example of the looplock circuit 320 including the sensing circuit 321 and the second NMOSFET M31 will be described.

In FIG. 3, the sensing circuit 321 may sense the level of the output voltage of the current control amplifier 310 using a plurality of resistors connected between the output terminal of the current control amplifier 310 and the ground.

For example, when two resistors R31 and R32 are included therein, the output voltage of the current control amplifier 310 is divided by the two resistors R31 and R32 to be sensed at the connection node of the two resistors R31 and R32.

Then, the second NMOSFET M31 has the internal resistor controlled according to the voltage level of the sensing circuit 321 applied to the gate thereof.

Accordingly, since the control voltage Vramp is divided by the internal resistor of the second NMOSFET M31 and the input resistor R30, the internal resistor of the second NMOSFET M31 is controlled, such that the first voltage V1 applied to the second input terminal of the current control amplifier 310 is controlled.

Then, referring to FIG. 4, the current bias circuit unit 400 may include the third NMOSFET M41 and the fourth NMOSFET M42 formed in a stack structure between the second power supply terminal for receiving the preset regulating voltage Vreg and the ground.

In this case, the current flowing in the third NMOSFET M41 is controlled according to the control of the current control unit 300, and the current flowing in the fourth NMOSFET M42 connected to the third NMOSFET M41 in the stack structure is also controlled.

In addition, referring to FIG. 4, the power amplifier 50 is driven according to the driving voltage Vd and the driving current Id from the power regulator 100 to amplify the input signal Sin, as described above.

More specifically, the IPD of the power amplifier 50 transfers the driving voltage Vd and the driving current Id from the power regulator 100 to the first and second terminals.

The coil unit 51 of the power amplifier 50 includes the first coil L51 connected to the first terminal of the IPD and the second coil L52 connected to the second terminal of the IPD to remove noise and ripple components of the driving voltage Vd.

Then, the first amplifying unit 52 and the second amplifying unit 53 of the power amplifier 50 are formed in the stack structure, and the first amplifying unit 52 and the second amplifying unit 53 are connected to the gates of the third NMOSFET M41 and the fourth NMOSFET M42 of the current bias circuit unit 400, respectively, such that the bias current is controlled according to the control of the current bias circuit unit 400.

In the power amplifying apparatus according to the exemplary embodiment of the present invention as described above, the current control unit 300 further including the looplock circuit 320 as shown in FIG. 3 will be described with reference to FIG. 5.

As shown in FIG. 5, referring to relationship between the sensed voltage Vsen, corresponding to the sensed current Isen in the current sensing unit 200, and the voltage V1, applied to the first input terminal of the current control amplifying 310 and corresponding to the sensed voltage Vsen, it may be appreciated that the first voltage V1 follows the sensed voltage Vsen, and the control voltage Vramp follows the sensed voltage Vsen even between 1.5 V and 2.0 V, which indicate that the control is properly performed even at a high input voltage Vin of about 2.0 V.

As set forth above, according to exemplary embodiments of the present invention, current may be sensed without a current mirror circuit to thereby reduce the size and costs of a power amplifying apparatus and reduce an error generated in the current mirror circuit, whereby improved current control performance can be achieved. In addition, a load limiting phenomenon may be removed to thereby improve the current control performance.

While the present invention has been shown and described in connection with the exemplary embodiments, it will be apparent to those skilled in the art that modifications and variations can be made without departing from the spirit and scope of the invention as defined by the appended claims.

What is claimed is:

1. A power amplifying apparatus, comprising:
a power amplifier;
a power regulator configured to provide, to the power amplifier, a driving voltage and a driving current corresponding to a preset control voltage;
a current sensing unit configured to sense a current and a voltage corresponding to the driving current and to control the driving voltage according to the sensed current;
a current control unit configured to control a current bias according to the sensed voltage; and
a current bias circuit unit configured to control a bias current of the power amplifier according to the controlling of the current control unit, wherein
the power regulator includes:
a power transistor circuit including a first PMOSFET having a source connected to a first power supply terminal, a gate, and a drain connected to a power supply node of the power amplifier, the power transistor circuit being configured to supply the driving voltage and the driving current to the power amplifier according to a gate voltage of the first PMOSFET; and
a first error amplifier having an inverted input terminal for receiving the control voltage, a non-inverted input terminal connected to the drain of the first PMOSFET through a first resistor and connected to a ground through a second resistor, and an output terminal connected to the gate of the first PMOSFET to provide the gate voltage.

2. The power amplifying apparatus of claim 1, wherein the power regulator further includes a first coil connected between a first connection node and the power supply node of the power amplifier, the first connection node being a node between the drain of the first PMOSFET and the first resistor.

3. The power amplifying apparatus of claim 1, wherein the current sensing unit includes:
a sensing transistor circuit including a second PMOSFET having a source connected to the first power supply terminal for receiving a power supply voltage, a gate connected to the gate of the first PMOSFET, and a drain, the second PMOSFET being configured to sense a current corresponding to a current flowing in the first PMOSFET;
a current control circuit including a first NMOSFET having a drain connected to the drain of the second PMOSFET, a gate, and a source;
a second error amplifier having an inverted input terminal connected to the first connection node, a non-inverted input terminal connected to a second connection node between the second PMOSFET and the first NMOSFET, and an output terminal connected to the gate of the first NMOSFET; and a voltage sensing unit configured to sense a sensed voltage corresponding to a sensed current flowing in the second PMOSFET and the first NMOSFET.

4. The power amplifying apparatus of claim 1, wherein the current control unit is configured to control the current bias so that the control voltage follows the sensed voltage of the current sensing unit.

5. The power amplifying apparatus of claim 4, wherein the current control unit includes a current control amplifier having a first input terminal for receiving a first voltage corresponding to the sensed voltage, a second input terminal for receiving the control voltage, and an output terminal for providing, to the current bias circuit unit, a gate voltage for controlling the bias current according to a voltage difference between the sensed voltage and the control voltage.

6. The power amplifying apparatus of claim 1, wherein the current bias circuit unit includes a second NMOSFET and a third NMOSFET configured to operate according to the controlling of the current control unit and formed in a cascode structure.

7. The power amplifying apparatus of claim 6, wherein the power amplifier includes:

an integrated passive device (IPD) for transferring the driving voltage and the driving current from the power regulator to first and second terminals thereof;

a coil unit including a first coil connected to the first terminal of the IPD and a second coil connected to the second terminal of the IPD;

a first amplifying unit having a bias controlled according to the controlling of the current bias circuit unit; and a second amplifying unit connected to the first amplifying unit in a cascode structure and having a bias controlled according to the controlling of the current bias circuit unit.

8. A power amplifying apparatus comprising:
a power amplifier;
a power regulator providing a driving voltage and a driving current corresponding to a preset control voltage;
a current sensing unit sensing a current and a voltage corresponding to the driving current and controlling the driving voltage according to the sensed current;
a current control unit controlling a current bias according to the sensed voltage of the current sensing unit; and
a current bias circuit unit controlling a bias current of the power amplifier according to the controlling of the current control unit, wherein
the current control unit is configured to control the current bias so that the control voltage follows the sensed voltage of the current sensing unit, and
the current control unit includes:
a current control amplifier having a first input terminal receiving a first voltage corresponding to the sensed voltage, a second input terminal receiving the control voltage, and an output terminal providing a gate voltage for controlling the bias current according to a voltage difference between the sensed voltage and the control voltage to the current bias circuit unit; and
a looplock circuit controlling a level of an input voltage inputted to the second input terminal of the current control amplifier according to a level of an output voltage of the current control amplifier.

9. The power amplifying apparatus of claim 8, wherein the first input terminal of the current control amplifier is a non-inverted input terminal, and the second input terminal thereof is an inverted input terminal.

10. The power amplifying apparatus of claim 8, wherein the power regulator includes:

a power transistor circuit including a first PMOSFET having a source connected to a first power supply terminal, a gate, and a drain connected to a power supply node of the power amplifier and supplying the driving voltage and the driving current to the power amplifier according to a gate voltage of the first PMOSFET; and a first error amplifier having an inverted input terminal receiving the control voltage, a non-inverted input terminal connected to the drain of the first PMOSFET through a first resistor and connected to a ground through a second resistor, and an output terminal connected to the gate of the first PMOSFET to provide the gate voltage.

11. The power amplifying apparatus of claim 10, wherein the power regulator further includes a first coil connected between a first connection node, between the drain of the first PMOSFET and the first resistor, and the power supply node of the power amplifier.

12. The power amplifying apparatus of claim 10, wherein the current sensing unit includes:

a sensing transistor circuit including a second PMOSFET having a source connected to the first power supply terminal for receiving a power supply voltage, a gate connected to the gate of the first PMOSFET, and a drain, and sensing a current corresponding to a current flowing in the first PMOSFET;

a current control circuit including a first NMOSFET having a drain connected to the drain of the second PMOSFET, a gate, and a source;

a second error amplifier having an inverted input terminal connected to the first connection node, a non-inverted input terminal connected to a second connection node between the second PMOSFET and the first NMOSFET, and an output terminal connected to the gate of the first NMOSFET; and a voltage sensing unit sensing a sensed voltage corresponding to a sensed current flowing in the second PMOSFET and the first NMOSFET.

13. The power amplifying apparatus of claim 8, wherein the looplock circuit includes:

a sensing circuit sensing a level of the output voltage of the current control amplifier using a plurality of resistors connected between the output terminal of the current control amplifier and a ground; and a second NMOSFET having a gate receiving a voltage of the sensing circuit, a drain connected to the second input terminal of the current control amplifier, and a gate connected to the ground, and having an internal resistor controlled according to a voltage level of the sensing circuit.

14. The power amplifying apparatus of claim 8, wherein the current bias circuit unit is configured to include a third NMOSFET and a fourth NMOSFET operating according to the controlling of the current control unit and formed in a cascode structure.

15. The power amplifying apparatus of claim 14, wherein the power amplifier includes:

an integrated passive device (IPD) transferring the driving voltage and the driving current from the power regulator to first and second terminals thereof;

a coil unit including a first coil connected to the first terminal of the IPD and a second coil connected to the second terminal of the IPD;

a first amplifying unit having a bias controlled according to the controlling of the current bias circuit unit; and a second amplifying unit connected to the first amplifying unit in a cascode structure and having a bias controlled according to the controlling of the current bias circuit unit.

16. A power amplifying apparatus, comprising:

a power amplifier;

a power regulator configured to provide, to the power amplifier, a driving voltage and a driving current corresponding to a preset control voltage;

a current sensing unit configured to sense a current and a voltage corresponding to the driving current and to control the driving voltage according to the sensed current;

a current control unit configured to control a current bias according to the sensed voltage; and a current bias circuit unit configured to control a bias current of the power amplifier according to the controlling of the current control unit, wherein the current bias circuit unit includes a first NMOSFET and a second NMOSFET configured to operate according to the controlling of the current control unit and formed in a cascode structure, and the power amplifier includes:

an integrated passive device (IPD) for transferring the driving voltage and the driving current from the power regulator to first and second terminals thereof;

a coil unit including a first coil connected to the first terminal of the IPD and a second coil connected to the second terminal of the IPD;

a first amplifying unit having a bias controlled according to the controlling of the current bias circuit unit; and a second amplifying unit connected to the first amplifying unit in a cascode structure and having a bias controlled according to the controlling of the current bias circuit unit.

\* \* \* \* \*